(12) United States Patent
Sasaki et al.

(10) Patent No.: US 7,371,694 B2
(45) Date of Patent: May 13, 2008

(54) SEMICONDUCTOR DEVICE FABRICATION METHOD AND FABRICATION APPARATUS

(75) Inventors: Ken Sasaki, Hiroshima (JP); Hiroyuki Sakaue, Hiroshima (JP); Takayuki Takahagi, Hiroshima (JP)

(73) Assignee: Elpida Memory Inc., Tokyo (JP)

( * ) Notice: Subject to any disclaimer, the term of this patent is extended or adjusted under 35 U.S.C. 154(b) by 336 days.

(21) Appl. No.: 11/056,128

(22) Filed: Feb. 14, 2005

(65) Prior Publication Data

US 2005/0186804 A1    Aug. 25, 2005

(30) Foreign Application Priority Data

Feb. 13, 2004  (JP) ............................. 2004-036991

(51) Int. Cl.
*H01L 21/302* (2006.01)
*H01L 21/461* (2006.01)

(52) U.S. Cl. ........... 438/745; 257/E21.21; 257/E21.22; 438/747

(58) Field of Classification Search ................ 438/745, 438/747, 748, 906; 257/E21.219, E21.224, 257/E21.228
See application file for complete search history.

(56) References Cited

U.S. PATENT DOCUMENTS

2002/0036006 A1* 3/2002 Ueda et al. ................... 134/33
2003/0121538 A1* 7/2003 Zahorik et al. ............. 134/184
2004/0069329 A1* 4/2004 de Larios et al. .......... 134/95.2
2005/0000545 A1* 1/2005 Inagaki ....................... 134/18

FOREIGN PATENT DOCUMENTS

| JP | 51-096288 | 8/1976 |
|---|---|---|
| JP | 4-306836 | 10/1992 |
| JP | 5-267260 | 10/1993 |
| JP | 8-013165 | 1/1996 |
| JP | 8-13165 | 1/1996 |
| JP | 11-135464 | 5/1999 |
| JP | 11-251270 | 9/1999 |
| JP | 2002-43274 | 2/2002 |
| JP | 2003-224096 | 8/2003 |

OTHER PUBLICATIONS

Taniguchi et al., "The Terminal Hydrogen Structure of Si(100) Surfaces Processed by NH₄F Heating," *Extended Abstracts: The 49th Spring Meeting of the Japan Society of Applied Physics and Related Societies*, Mar. 2002, p. 803.

Okamura et al., "Formation of Flat Si (100) Surfaces at the Atomic Level by Means of NH₄F Aqueous Solutions," *Extended Abstracts: The 50th Spring Meeting of the Japan Society of Applied Physics and Related Societies*, Mar. 2003, p. 853.

* cited by examiner

*Primary Examiner*—Caridad Everhart
(74) *Attorney, Agent, or Firm*—Young & Thompson

(57) ABSTRACT

The flatness of the surface of a Si substrate is requested as the present gate length is miniaturized. The present invention is a semiconductor device fabrication method for flattening a silicon surface by continuously supplying a high-temperature fluoride ammonium solution to the surface a silicon substrate in which at least the silicon surface is locally exposed.

18 Claims, 5 Drawing Sheets

SEMICONDUCTOR DEVICE FABRICATION METHOD AND FABRICATION APPARATUS

BACKGROUND OF THE INVENTION

1. Field of the Invention

The present invention relates to a semiconductor device fabrication method and its fabrication apparatus.

2. Description of the Related Art

A recent semiconductor integrated circuit device is extremely miniaturized and smoothness of the surface of a Si substrate does not catch up with miniaturization of a gate length. Therefore, it is considered that the unevenness of the surface of the Si substrate is a cause of gate withstands voltage trouble, current leak trouble, and refresh trouble of a random access memory.

The following are conventionally generally performed to flatten the surface of a Si substrate.
(1) The surface of the Si substrate is plane-polished to remove a surface flaw or unevenness which is produced when the Si substrate is sliced from ingot.
(2) The Si substrate is immersed in acid or alkali to remove a working strain layer on the surface of the wafer flattened to a certain extent through the above surface polishing and etched.
(3) The Si substrate is roughly polished to remove roughness or uneven thickness in both sides of the surface and back of the Si substrate.
(4) The Si substrate is finish-polished to flatten the small unevenness of the surface of the substrate.

Japanese Patent Laid-Open No. 11-135464 discloses a method using spin etching using mixed acid (hydrofluoric acid, nitric acid, sulfuric acid, and phosphoric acid) having a high etching rate and a uniform etching characteristic in order to efficiently remove a working strain layer produced through flattening such as plane polishing without damaging the flatness of the surface of a wafer.

However, a conventional the Si-substrate surface-flattening method cannot sufficiently flatten the surface of a substrate. Therefore, it is difficult to reduce gate withstand voltage troubles, current leak troubles, and refresh troubles of a random access memory, which may be due to the unevenness of the substrate surface.

In the case of a present semiconductor device having a gate length of 200 nm or less, reduction of the thickness of a transistor gate oxide film is rapidly progressed and the film thickness of the device is smaller than 4 nm. When the means square roughness of the surface of a Si substrate is 0.2 nm, it is estimated that the maximum unevenness is approx. 2 nm and this occupies 50% of a gate oxide film thickness becomes a level which cannot be ignored for the semiconductor device any longer.

However, the flatness according to the above method ranges between 0.2 and 0.3 nm in terms of the mean square roughness and the present semiconductor device of 200 nm or less is not always sufficiently flattened.

However, the present inventor et al. study the unevenness control (Non-patent Document: "Hydrogen termination structure of heat-$NH_4F$-treated Si (100) surface "written by Yutaka Taniguchi, Yosuke Okamura, Hiroyuki Sakaue, Shouzou Shingobara, and Takayuki Takahagi in preliminary report collection of 49th Japan Society of Applied Physics in Spring, 2002) of Si substrate surface in accordance with the immersion-type wet method using the fluoride ammonium and find that it is possible to reduce the mean square roughness to 0.1 nm. However, as a result of applying the unevenness control to a Si substrate having a diameter of 20 cm, the mean square roughness becomes 0.15 nm. Therefore, when applying the unevenness control to a Si substrate having a diameter of 30 cm which is the main stream of present random access memories, the mean square roughness may be further impaired. Moreover, when the mean square roughness is 0.15 nm, it is insufficient for future reduction of a gate length.

Furthermore, the content of the Non-patent Document can be applied to the surface of a Si substrate according to the prior art. In the case of fabrication of a semiconductor integrated circuit device, however, the roughness of a substrate just before forming a gate oxide film becomes a problem. Before forming a gate oxide film, polycrystalline silicon is formed on the back of a regular semiconductor integrated device for gettering and moreover, a groove is formed on the surface of the device for element isolation and then, an oxide film is embedded in the groove.

The polycrystalline silicon on the back is etched through the fluoride ammonium treatment and unevenness occurs and influences the flatness of a surface tail in the back end step.

SUMMARY OF THE INVENTION

The present invention is a semiconductor device fabrication method for flattening a silicon surface by continuously supplying a high-temperature fluoride ammonium solution to the surface of a silicon substrate in which at least the silicon surface is locally exposed. The present invention is a semiconductor device fabrication method comprising a step of rotating a silicon substrate at least on a part of which silicon is exposed, a step of substrate flattening step of supplying a fluoride ammonium solution onto the rotating silicon substrate, a rinsing step of supplying deionized water onto the silicon substrate after stopping supply of the fluoride ammonium solution, and a step of rotating and drying the silicon substrate after stopping supply of the deionized water.

A polycrystalline silicon layer is deposited on a back surface of the silicon substrate or a damage layer is made on the back of the silicon substrate or an element isolation groove and is formed or in which an element isolation film is formed on the element isolation groove or formed of at least an element isolation groove and an element isolation film formed on the element isolation groove, an element isolation film embedded in the element isolation groove, a gate oxide film, a gate made of polycrystalline silicon or amorphous silicon formed on the gate oxide film, and a sidewall insulating film formed on the side to the gate.

It is preferable that the fluoride ammonium solution used for the present invention ranges between 30 and 45 wt % (both included). Moreover, it is preferable that the fluoride ammonium solution ranges between 50° C. and 100° C. (both included).

It is preferable that the fluoride ammonium solution is supplied at a rate between 500 and 3,500 cc/min (both included) for 120 sec or more.

Moreover, the present invention is a semiconductor fabrication apparatus includes a substrate fixing table having means for fixing a silicon substrate, a substrate-fixing-table rotating means for rotating the substrate fixing table, drug solution holding means for holding a fluoride ammonium solution at a constant temperature, drug solution supplying means for supplying the fluoride ammonium solution to a nozzle from the drug solution holding means, means for stopping supply of the fluoride ammonium solution to the nozzle after the elapse of predetermined time and supplying deionized water to the nozzle, means for stopping supply of the deionized water to the nozzle after a predetermined time elapses, and substrate-fixing-table-rotation stopping means for stopping rotation of the substrate fixing means at a predetermined time after stopping supply of the deionized water to the nozzle.

DETAILED DESCRIPTION OF THE INVENTION AND PREFERRED EMBODIMENTS

The present invention prevents fluoride ammonium from entering the back of a Si substrate by supplying the fluoride ammonium to the surface of the Si substrate while rotating the Si substrate and at the same time, maximizes the surface unevenness flattening effect using the microbubble restraint effect by continuous contact of a fresh solution.

In the case of the present invention, it is only necessary to regularly supply a fluoride ammonium solution to a Si substrate and remove the reacted fluoride ammonium solution from the surface of the Si substrate. Therefore, it is not always necessary to rotate the substrate. For example, it is also allowed to tilt the substrate and blow the fluoride ammonium solution to the substrate. However, it is more preferable to rotate the substrate from the viewpoint of stopping the reaction between the Si substrate and fluoride ammonium.

The fluoride ammonium is supplied to the surface of the Si substrate by using a regular nozzle with the fluoride ammonium naturally flowing.

In the case of Si-substrate surface unevenness control according to the fluoride ammonium treatment, $SiH_2$ is present on the outermost surface if the surface of a Si substrate is hydrogen-terminated when viewing the surface of the Si substrate at an atomic level. On the surface of the Si substrate kept flattened with no damage, two hydrogen atoms combined with Si are symmetrically elastically vibrated. Moreover, when there is unevenness, asymmetric elastic vibration and symmetric elastic vibration are coexistent. As a result of comparing infrared absorption spectrums before and after performing the fluoride ammonium treatment, the asymmetric spectrum is not found after the treatment and it is supported that flattening is progressed. A step/terrace structure is locally observed on the surface of the Si substrate after the fluoride ammonium treatment through AFM and STM observation and it can be said that $SiH_2$ has an atomic-string lacking structure in which $SiH_2$ is easily symmetrically elastically vibrated.

Embodiments

In the case of a Si substrate of the present invention, only steps after polycrystalline silicon is formed on the back are described together with the following embodiments 1 to 3. Formation of polycrystalline silicon on the back is performed to obtain a gettering effect and it is needless to say that it is possible to use a method for obtaining the existing gettering effect such as forming a damage layer on the back.

Embodiment 1 Improvement of Transistor-gate Withstand Voltage Performance

Figure 1:
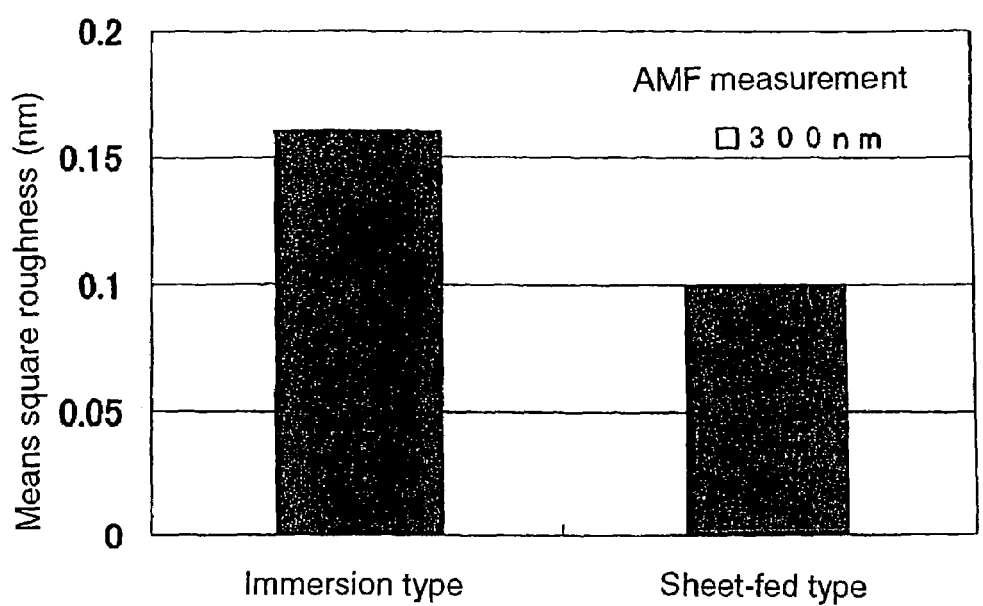
FIG. 1 is an illustration for comparing the mean square roughness by a conventional immersion type and the mean square roughness by a sheet-fed type of the present invention.
Figure 2:
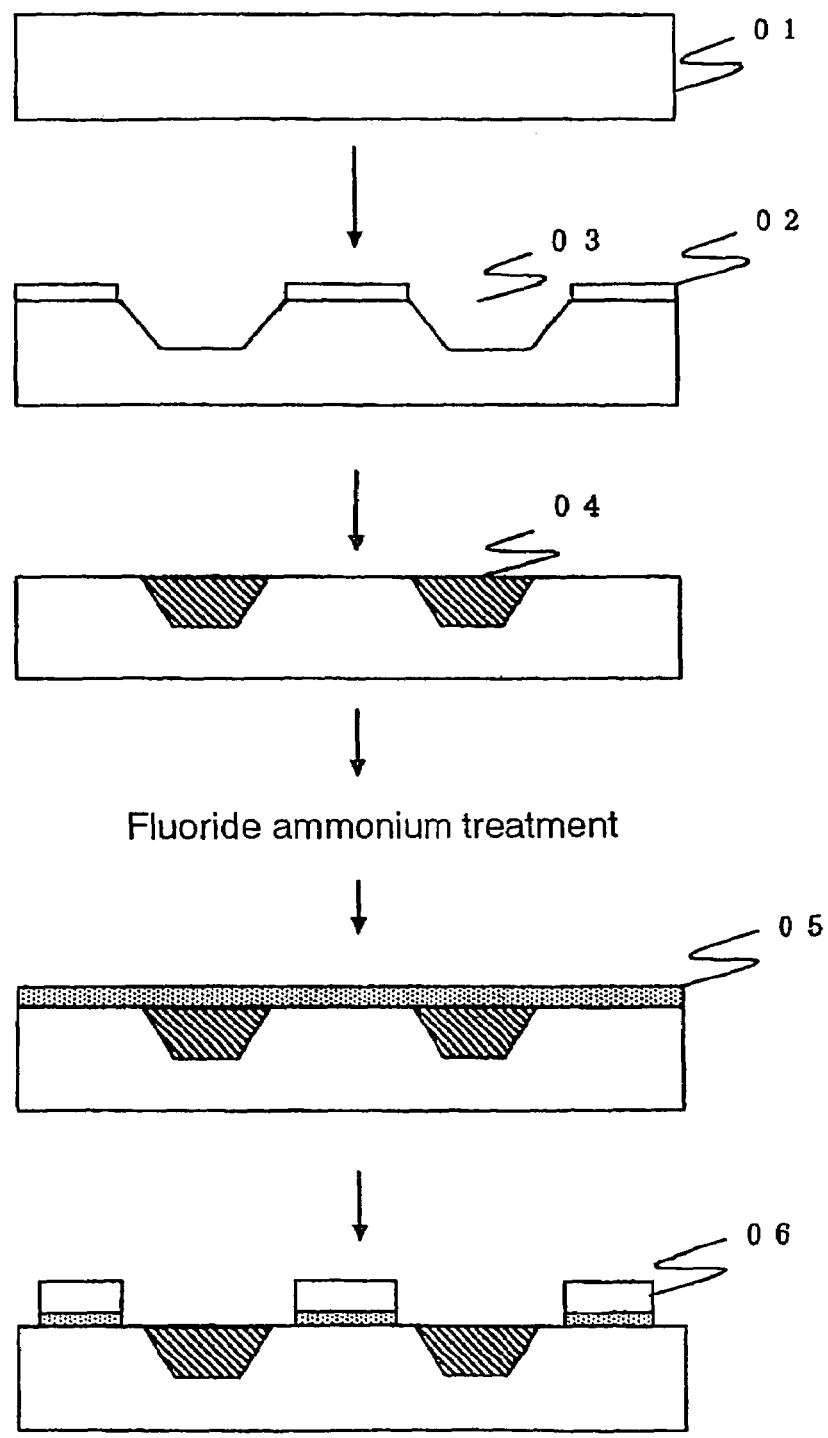
FIG. 2 is an illustration showing sectional views of fabrication steps of embodiment 1.

FIG. 2 shows a semiconductor device fabrication steps of improving a transistor-gate withstand voltage performance by using the present invention. First, SiN film (02) is formed on the surface of Si substrate (01) and the photoresist at the portion serving as an element isolation groove of the photoresist is removed by using photolithography to form element isolation groove (03) by using the regular etching method. Thereafter, the groove is embedded by element isolation film (04) formed of a silicon oxide film. Then, the fluoride ammonium treatment is performed immediately before a step of forming gate oxide film (05) of a transistor. The surface of the Si substrate on which the channel of the transistor is formed through the fluoride ammonium treatment is flattened and the quality of the gate oxide film is improved. Thereafter, gate oxide film (05) of the transistor is formed in a regular step and then gate (06) of the transistor made of polycrystalline silicon or the like is formed to finish a semiconductor device.

This embodiment has an advantage that a flat uniform gate oxide film is obtained because a silicon surface is flattened immediately before forming a gate oxide film.

Figure 3:
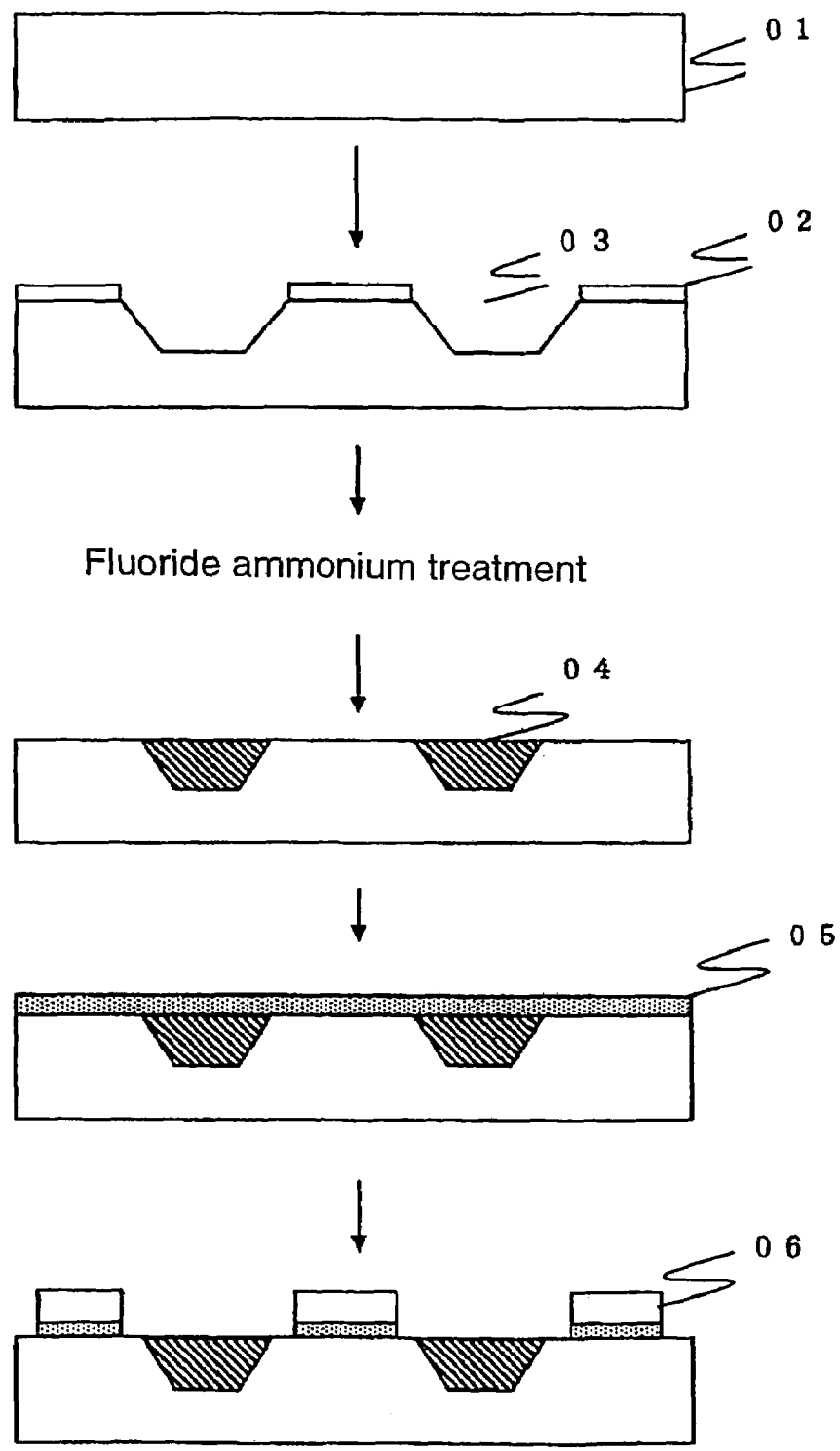
FIG. 3 is an illustration showing sectional views of fabrication steps of embodiment 2.

Embodiment 2 Decrease of Current Leak Troubles and Refresh Troubles from Element Isolation FIG. 3 shows a semiconductor device fabrication steps of reducing current leak troubles and refresh troubles by using the present invention. First, SiN film (02) is formed on Si substrate (01), the photoresist at the portion serving as an element isolation groove of the photoresist is removed by using photolithography, and element isolation groove (03) is formed by using the regular etching method. Then, the fluoride ammonium treatment is performed. Damages of the Si substrate due to the dry etching used for element isolation groove configuration are removed through the fluoride ammonium treatment. Then, the element isolation groove is embedded by an interceptive separation film formed of an oxide film.

In the case of this embodiment, because an etching damage layer on the surface of an element isolation groove is removed, current leak from a damage layer of the element isolation groove is reduced.

Thereafter, it is allowed to perform the fluoride ammonium treatment of the surface of a silicon substrate similarly to the case of the embodiment 1 and flatten the surface of the silicon substrate. By flattening the silicon substrate, the etching damage layer of an element isolation groove is removed and thereby current leak due to the element isolation groove is reduced and the surface of the silicon substrate is flattened. Therefore, there is an advantage that a uniform gate oxide film is obtained.

Thereafter, gate oxide film (05) of a transistor is formed and moreover, polycrystalline silicon (06) serving as the gate of the transistor is formed to finish a semiconductor device.

Figure 4:
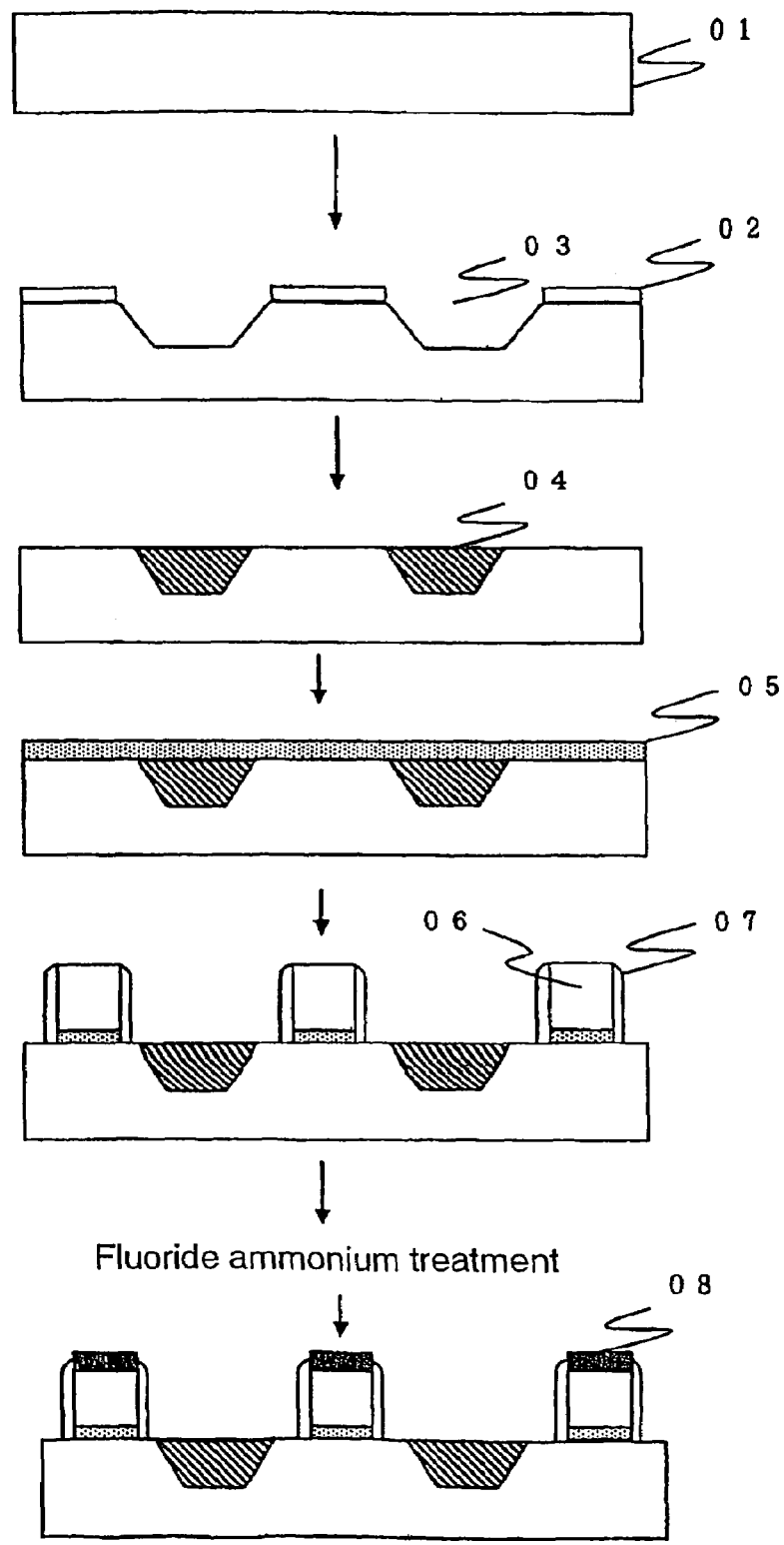
FIG. 4 is an illustration showing sectional views of fabrication steps of embodiment 3.

FIG. 4 shows semiconductor device fabrication steps for reducing metal-silicide layer formation troubles by using the present invention. Up to formation of gate oxide film (05) of a transistor, it is possible to use the same steps as the case of the Embodiments 1 and 2.

Points that when removing the etching damage layer of an element isolation groove by performing the fluoride ammonium treatment, current leak due to the element isolation groove can be decreased and when performing the fluoride ammonium treatment before a gate oxide film is grown, a uniform gate oxide film can be obtained because the surface of a silicon substrate is flattened are the same as the case of the embodiments 1 and 2.

In the case of this embodiment, gate oxide film (05) is formed and then polycrystalline silicon of gate (06) of a transistor is formed to form sidewall (07) formed of an oxide film on the side of gate (06).

Sidewall (07) is formed by forming gate (06), then forming an oxide film on the entire surface, and removing the oxide film on gate (06) through anisotropic dry etching.

It is a necessary condition that films referred to as an oxide film and SiN film in the embodiments 1 to 3 are insulating films but it is not always necessary to use the oxide film and SiN film. Various films to be replaced with an oxide film and SiN film respectively having a low dielectric constant are announced because semiconductor integrated circuit devices are recently miniaturized. It is needless to say that there is no problem even if using these films.

An etching damage due to anisotropic dry etching occurs on the surface of a gate on which a sidewall is formed. The etching damage layer is removed through the fluoride ammonium treatment. The etching damage layer on silicon surface causes problems that a short circuit occurs between a gate, source, and drain due to abnormal growth of silicide and the resistance value of a silicide layer is not sufficiently raised.

By removing the etching damage layer, it is possible to reduce metal-silicide-layer formation troubles. Then, metal-silicide layer (08) is formed in accordance with the regular flow to finish a semiconductor device.

Removal of an etching damage layer by fluoride ammonium shown for the embodiments 2 and 3 has an advantage that it is possible to terminate hydrogen to the dangling bond of Si on the surface of a Si substrate compared to the case of conventional etching by a hydrofluoric acid treatment or buffered hydrofluoric acid treatment.

Then, the fluoride ammonium treatment of the present invention is described below in detail.

Figure 5:
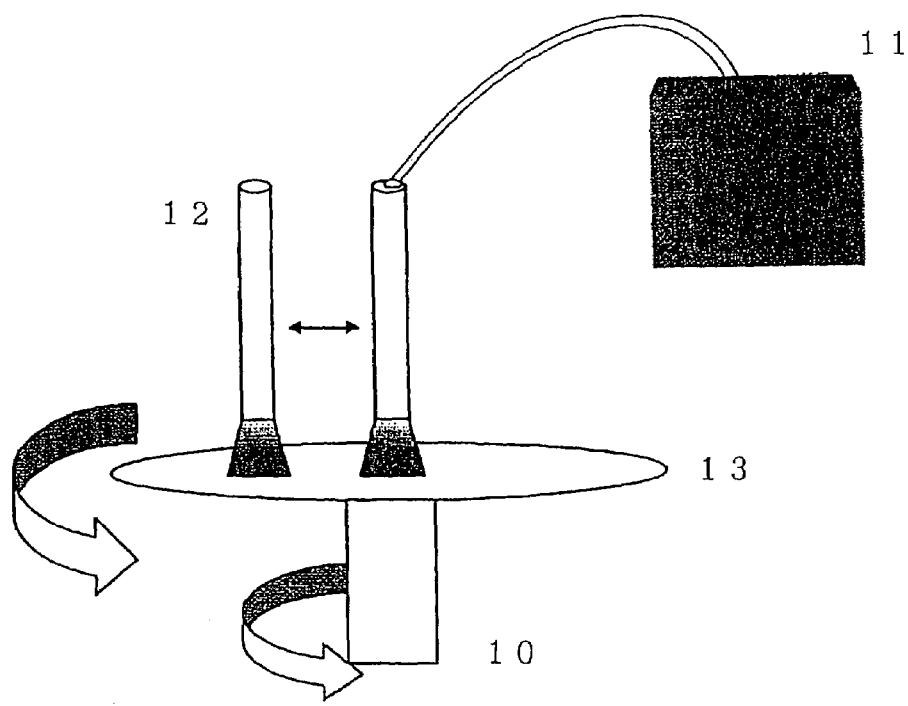
FIG. 5 is a schematic view of a sheet-fed-type WET fabrication apparatus.

A configuration of the sheet-fed-type WET apparatus in FIG. 5 is described below.

The sheet-fed-type WET apparatus has a wafer rotating power support (10) having a pedestal for fixing a silicon substrate (13) and a motor (not illustrated) for rotating the wafer rotating power support. The silicon substrate is fixed to the wafer rotating power support by vacuum attraction (bringing the substrate into a reduced-pressure state by an attraction motor (not illustrated)).

The fluoride ammonium solution in a solution tank (11) for keeping the fluoride ammonium solution at a constant temperature is supplied to a solution discharge nozzle (12) at a rate of 2,500 cc//min for a certain time.

The solution discharge nozzle (12) is located at the center of a silicon substrate so as to be movable in the diameter direction of the silicon substrate (13) at a constant speed by using, for example, a motor after a solution is supplied to the nozzle (not illustrated).

For example, by using a timer, supply of the fluoride ammonium solution to the drug-solution discharge nozzle is stopped after a predetermined time elapses and deionized water is supplied to the nozzle for a predetermined time to clean (rinse) the silicon substrate. It is allowed to use the same nozzle or different nozzles as the solution discharge nozzle and deionized-water supply nozzle.

Supply of the deionized water to the nozzle is stopped after a predetermined time elapses and then, rotation of the silicon substrate is kept for a certain time to dry the silicon substrate.

Then, steps of flattening a silicon substrate of the present invention is described below.

The 40%-fluoride ammonium serving as a solution is kept at 80° C. in a solution tank, a silicon substrate is rotated at 300 rpm, fluoride ammonium is supplied to the substrate from a fluoride ammonium discharge nozzle at a rate of 2,500 cc/min to perform a treatment for 120 sec while moving the nozzle on a wafer radius at 3.3 cm/sec. Then, deionized water is discharged for 110 sec while rotating the wafer at 1,500 rpm and the wafer is rinsed and then dried for 30 sec while rotating the wafer at 3,000 rpm.

It is preferable that the temperature of the fluoride ammonium solution ranges between 50° C. and 100° C. (both included). In the case of 50° C. or higher, the effect of flattening the silicon substrate is obtained. In the case of 100° C. or lower, the surface of the silicon substrate is not roughened. It is more preferable that the temperature ranges between 60° C. and 90° C. (both included).

The fluoride ammonium solution uses the commercial solution made by Stella Chemifa Corporation having a concentration of 40 wt %. The upper limit of a concentration of a fluoride ammonium solution is decided in accordance with solubility. However, when the concentration is 30 wt % or more, there is no problem in flatness.

Though the rotating speed of a silicon substrate does not influence flatness. it is preferable that the speed ranges between 100 and 1,000 rpm (both included). In the case of 1,000 rpm or less, the following does not occur: flatness is disordered because the pressure of a fluoride ammonium solution to a silicon substrate becomes too strong or the fluoride ammonium solution gets out of an apparatus. In the case of 100 rpm or more, fresh solution is always supplied to the silicon substrate, the silicon substrate is flattened, but the fluoride ammonium solution does not reach the back of the silicon substrate.

When a nozzle is fixed, the flatness of the surface of a substrate is fluctuated because a fluoride ammonium solution hits a specific portion of the substrate. Therefore, it is preferable to move the nozzle. Flatness is not fluctuated by moving the nozzle at a speed of 2 cm/sec to 5 cm/sec though the optimum value of the moving speed depends on the quantity of the fluoride ammonium solution to be supplied or the dimension of the substrate.

In the case of a drug solution, the same result is obtained even if using the spraying method and the free dripping method.

Figure 6:
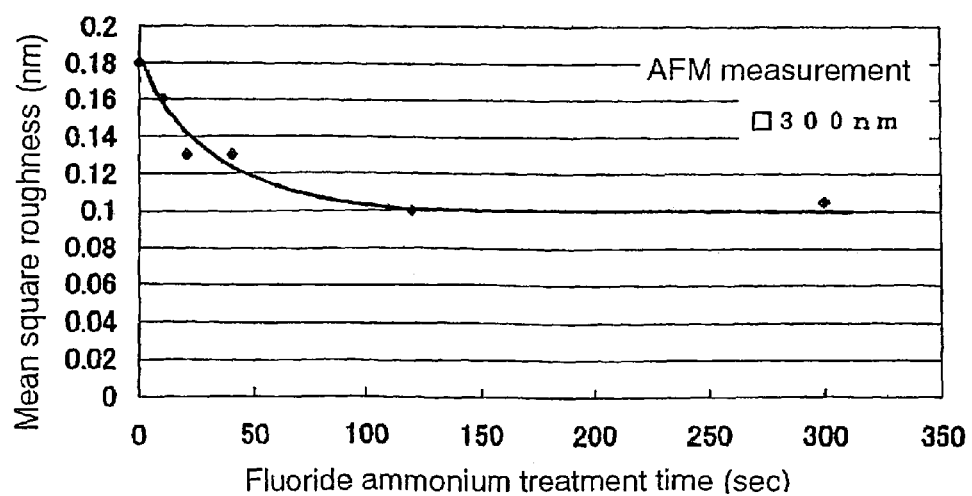
FIG. 6 is an illustration showing a relation between drug-solution treatment time and mean square roughness.

When the solution treatment time is 120 sec or more, the maximum flattening effect is obtained as shown in FIG. 6.

By using a sheet-fed-type WET apparatus, only the surface of a Si substrate can be selectively treated by a solution and the polycrystalline silicon on the back of a silicon substrate is etched by a fluoride ammonium solution but unevenness is not formed.

When unevenness is formed on the back of the silicon substrate, it causes a patter formation trouble in the next patterning photoresist step. Therefore, it must be avoided that unevenness is formed on the back of a wafer.

High-temperature fluoride ammonium has a function for regularizing a Si atomic arrangement. The present invention basically uses the principle. Even if using an immersion-type WET apparatus, the surface unevenness flattening effect is obtained. However, by continuously supplying a fresh fluoride ammonium solution to the surface of a silicon substrate like the case of the present invention, the mean square roughness becomes 0.10 nm and flatness 30% better than the case of the conventional immersion method is obtained.

The roughness of the surface of a Si substrate is measured by using an atomic force microscope (AMF).

In the case of a sheet-fed-type WET apparatus of the present invention, the same flatness is obtained for a Si substrate having a diameter of 20 cm and a Si substrate having a diameter of 30 cm.

In the case of an immersion-type WET apparatus, because the convection of a solution is small, a factor for interrupting a function for regularizing the Si atomic arrangement by fluoride ammonium cannot be completely eliminated. However, like the present invention, a higher flatness can be obtained by continuously supplying a fresh fluoride ammonium solution to the surface of a silicon substrate. Moreover, in the case of rinsing by deionized water, it is possible to uniformly remove a solution in a short time compared to the case of the immersion method and uniformly complete the Si atomic arrangement regularizing function of fluoride ammonium.

It is an object of the present invention to provide a semiconductor wafer fabrication method making it possible to accurately flatten the unevenness of the surface of a Si substrate.

By continuously supplying high-temperature fluoride ammonium to the surface of a Si substrate, a fresh solution always contacts with the surface of a Si substrate and thereby, the microbubble restraint effect can be used and the surface unevenness flattening effect can be maximized.

Because the Si substrate is rotated, flattening of unevenness on the surface of the Si substrate can be achieved without damaging the wafer back.

Even when performing gettering by damaging the back, unevenness is not formed on the back because a solution does not reach the back by using the above method.

Because polysilicon or a damage layer formed on the back is not removed through etching, a problem does not occur that the gettering effect cannot be obtained other than the flatness in a subsequent step such as a photolithography step because unevenness occurs on the back.

The present invention makes it possible to improve the quality and uniformity of a gate oxide film of a semiconductor integrated circuit device, restrain leakage from an element isolation, and improve a gate withstand voltage, a micro-current trouble, and refresh trouble of a random access memory.

What is claimed is:

1. A semiconductor device fabrication method for flattening a silicon surface of a silicon substrate, comprising:
   providing the silicon substrate with a polycrystalline layer on a back surface of the silicon substrate; and
   continuously supplying a high-temperature ammonium fluoride solution to a surface of the silicon substrate from which at least a silicon surface is locally exposed.

2. The semiconductor device fabrication method according to claim 1, wherein a damage layer is made on a back surface of the silicon substrate.

3. The semiconductor device fabrication method according to claim 1, wherein an element isolation groove and an element isolation film formed on the element isolation groove is formed on the surface of the silicon substrate.

4. The semiconductor device fabrication method according to claim 1, wherein an element isolation groove is formed on the surface of the silicon substrate.

5. The semiconductor device fabrication method according claim 1, wherein after the flattening the silicon surface further step of a gate oxide formed on the silicon surface which is locally exposed.

6. The semiconductor device fabrication method according to claim 1, wherein the temperature of the high-temperature ammonium fluoride solution ranges between 50° C. and 100° C. (both included).

7. The semiconductor device fabrication method according to claim 1, wherein the ammonium fluoride solution is supplied at a rate between 500 cc/min and 3,500 cc/min (both included).

8. The semiconductor device fabrication method according to claim 1, wherein the ammonium fluoride solution is supplied for 120 sec or more.

9. A semiconductor device fabrication method for flattening a silicon surface of a silicon substrate, comprising:
   providing the silicon substrate with a polycrystalline layer on a back surface of the silicon substrate; and continuously supplying a high-temperature ammonium fluoride solution of 30 wt % or more to a surface of the silicon substrate from which at least a silicon surface is locally exposed.

10. A semiconductor device fabrication method comprising:
    providing a silicon substrate having a polycrystalline layer on a back surface of the silicon substrate;
    rotating the silicon substrate in which a silicon surface is exposed on at least a part of the silicon substrate;
    flattening the substrate by supplying a ammonium fluoride solution onto the rotating silicon substrate;
    rinsing by supplying deionized water onto the silicon substrate after stopping supply of the ammonium fluoride solution; and
    rotating and drying the silicon substrate after stopping supply of the deionized water.

11. The semiconductor device fabrication method according to claim 10, wherein a damage layer is made on a back surface of the silicon substrate.

12. The semiconductor device fabrication method according to claim 10, wherein an element isolation groove and an element isolation film formed on the element isolation groove is formed on the surface of the silicon substrate.

13. The semiconductor device fabrication method according to claim 10, wherein an element isolation groove is formed on the surface of the silicon substrate.

14. The semiconductor device fabrication method according claim 10, wherein after the flattening the substrate, a gate oxide formed on the silicon surface which is locally exposed.

15. The semiconductor device fabrication method according to claim 10, wherein the temperature of the high-temperature ammonium fluoride solution ranges between 50° C. and 100° C. (both included).

16. The semiconductor device fabrication method according to claim 10, wherein the ammonium fluoride solution is supplied at a rate between 500 cc/min and 3,500 cc/min (both included).

17. The semiconductor device fabrication method according to claim 10, wherein the ammonium fluoride solution is supplied for 120 sec or more.

18. A semiconductor device fabrication method comprising:

providing a silicon substrate having a polycrystalline layer on a back surface of the silicon substrate;

rotating the silicon substrate in which a silicon surface is exposed on at least a part of the silicon substrate;

flattening the substrate by supplying an ammonium fluoride solution 30 wt % or more onto the rotating silicon substrate;

rinsing by supplying deionized water onto the silicon substrate after stopping supply of the ammonium fluoride solution; and rotating and drying the silicon substrate after stopping supply of the deionized water.

* * * * *